(12) United States Patent
Toyoda et al.

(10) Patent No.: US 7,890,967 B2
(45) Date of Patent: Feb. 15, 2011

(54) OPTICAL PICKUP DEVICE WITH HEAT RADIATING STRUCTURE

(75) Inventors: Hiroyuki Toyoda, Hitachinaka (JP); Junichi Senga, Yokohama (JP); Takayuki Fujimoto, Tsuchiura (JP); Seiichi Katou, Tsuchiura (JP); Hitoshi Matsushima, Ryugasaki (JP)

(73) Assignee: Hitachi Media Electronics Co., Ltd., Iwate (JP)

( * ) Notice: Subject to any disclaimer, the term of this patent is extended or adjusted under 35 U.S.C. 154(b) by 1057 days.

(21) Appl. No.: 11/626,866

(22) Filed: Jan. 25, 2007

(65) Prior Publication Data
US 2008/0074962 A1    Mar. 27, 2008

(30) Foreign Application Priority Data
Sep. 26, 2006  (JP) .............................. 2006-260642

(51) Int. Cl.
G11B 33/14   (2006.01)
G11B 17/00   (2006.01)
G11B 21/16   (2006.01)

(52) U.S. Cl. .................................... 720/649; 369/244.1
(58) Field of Classification Search ................. 720/658, 720/648, 649; 369/244.1, 249.1, 100, 112.01
See application file for complete search history.

(56) References Cited
U.S. PATENT DOCUMENTS
2004/0179437 A1* 9/2004 Washiyama .............. 369/44.11
2005/0249055 A1* 11/2005 Ochi et al. ............... 369/44.14
2006/0120226 A1* 6/2006 Mutou et al. ............. 369/44.11

FOREIGN PATENT DOCUMENTS
| JP | 06-203403 | 7/1994 |
| JP | 10-083564 | 3/1998 |
| JP | 2000-251297 | 9/2000 |
| JP | 2003-59076 | 2/2003 |
| JP | 2004-103084 | 4/2004 |
| JP | 2004-214331 | 7/2004 |
| JP | 2005-235288 | 9/2005 |

* cited by examiner

Primary Examiner—Craig A. Renner
Assistant Examiner—Gustavo Polo
(74) Attorney, Agent, or Firm—Antonelli, Terry, Stout & Kraus, LLP.

(57) ABSTRACT

An optical pickup device 50 comprising a laser diode 1, a photo detector 2, a housing 3 having an optical system for guiding light from the laser diode 1 to an optical disk and guiding light reflected on the optical disk to the photo detector, a wiring 5 to supply current to the laser diode 1, and a metallic cover 9 provided outside of the housing 3, wherein the laser diode 1 is bonded to the housing 3 by adhesive, a metallic member 10 is mounted on the surface of the laser diode 1 by connecting thermally, and the metallic member 10 is thermally connected to the cover 9 by solder.

4 Claims, 6 Drawing Sheets

OPTICAL PICKUP DEVICE WITH HEAT RADIATING STRUCTURE

CLAIM OF PRIORITY

The present application claims priority from Japanese application serial No. 2006-260642, filed on Sep. 26, 2006, the contents of which is hereby incorporated by reference into this application.

BACKGROUND OF THE INVENTION

1. Field of Invention

This invention relates to an optical pickup device. More particularly, it relates to an optical pickup device equipped with a metallic cover for covering wires of a laser diode.

2. Prior Art

An optical disk device is provided with an optical pickup device to write information on an optical disk and read information therefrom by a laser diode. The laser diode may be very hot under some operating conditions. If the laser diode is used long time at a high operating temperature, its efficiency, service life, and reliability go down. To prevent this, the optical pickup device must be designed to be high heat radiation performance so that the laser diode may always work below its assured maximum operating temperature.

Particularly in recent years, optical disk devices have been demanded to shorten time to record and reproduce information. This makes the laser diodes have higher outputs and become much hotter. Therefore, it is very important to increase the heat radiation performance of the laser diode.

The temperature of the laser diode in the optical pickup device can be reduced by increasing the quantity of heat release from the laser diode, that is, by reducing the heat resistance of a heat-radiating route from the laser diode to a housing or providing a heat-radiating route from the laser diode to non-housing parts.

Japanese Patent Application Laid-Open Publication No. Hei 10-83564 (Patent Document 1) discloses a method of caulking a lead-frame type laser diode to the metallic housing. This method can reduce the heat resistance between a laser diode and a metallic housing and increase the characteristics of the heat radiation performance to release heat from the metallic housing without aged deterioration change in connection of the laser diode and the metallic housing.

Japanese Patent Application Laid-Open Publication No. 2000-251297 (Patent Document 2) discloses an optical pickup device comprising a laser diode equipped with a common terminal, a printed circuit board connected to the laser diode, and a shield casing to cover the printed circuit board and the bottom of the laser diode, wherein the common terminal is soldered to the shield casing to transfer heat from the laser diode to the shield casing.

Japanese Patent Application Laid-Open Publication No. 2005-235288 (Patent Document 3) discloses an optical pickup device wherein a laser diode is supported by a first supporting member with large thermal conductivity, the first supporting member is soldered to a second supporting member with smaller thermal conductivity than that of the first supporting member and supported by a carriage, and the first supporting member is connected to the carriage through a thermal conductive material with high thermal conductivity, so that heat generated in the laser diode is efficiently transferred to the first supporting member and then to a place far from the laser diode through said thermal conductive material.

Patent Document 1: Japanese Patent Application Laid-Open Publication No. Hei 10-83564
Patent Document 2: Japanese Patent Application Laid-Open Publication No. 2000-251297
Patent Document 3: Japanese Patent Application Laid-Open Publication No. 2005-235288

SUMMARY OF THE INVENTION

In the Patent Document 1, the heat of the laser diode is released only through the metallic housing and the housing material is limited to metals. This increases the production cost of the optical pickup. Further, in the Patent Document 1, the laser diode is fixed to the metallic housing by caulking. So, the optical axis of laser light emitted from the laser diode due to a production error cannot be adjusted. In other words, it frequently happens that the optical axis of laser light emitted from the laser diode is sometimes shifted a little from the external dimensions of the laser diode by machine tolerance during production. Accordingly, when the laser diode is mounted on the housing, the optical axis of the laser light must be adjusted. However, the optical pickup device in the Patent Document 1 can not adjust the optical axis of the laser light. Therefore, the optical axis of the laser light must be adjusted when the laser diode is mounted in the housing and the clearance of adjustment between the housing and the laser diode must be filled with adhesives.

Further, the Patent Document 2 uses a thermal connection between the end of a slender common terminal and a shield casing. This connection increases the heat resistance and is not effective in heat radiation.

The Patent Document 3 describes that a first supporting member supported by a laser diode is soldered to a second supporting member and supported by a carriage. However, solder is not so reliable as a structural material and this structure cannot be a high-reliability supporting structure. In the Patent Document 3, heat of the laser diode is released only through the carriage. Therefore, the carriage must be made of metal. This necessarily increases the production cost of the optical pickup.

An object of the present invention is to provide an optical pickup device to assure high reliability and productivity by providing a heat-radiating path from a laser diode to a housing, increase heat releasing ability of the laser diode by providing a heat-radiating path with low thermal conductivity towards other than the housing, and give high heat releasing ability also to a plastic housing.

To achieve the above object, this invention relates to an optical pickup device comprising a laser diode, a photo detector, a housing having an optical system for guiding light from the laser diode to an optical disk and guiding light reflected on the optical disk to the photo detector, a wiring to supply current to the laser diode, and a metallic cover provided outside of the housing, wherein the laser diode is bonded to the housing by adhesive, a metallic member is mounted on the surface of the laser diode by connecting thermally, and the metallic member is thermally connected to the cover by solder.

Below are listed preferred concrete embodiments.

(1) The laser diode comprises a frame made of conductive metal, a laser diode chip provided on one of flat surfaces of the frame, and multiple terminals protruded from the other flat surface of the frame, and the metallic member is thermally connected to the other flat surface of the frame.

(2) The laser diode is fixed to a support member equipped with a protrusion for working as a rotary shaft, the support member is bonded to the housing by the adhesive so that the support member can rotate with the protrusion as a rotating axis, the metallic member is extended along the rotary shaft of the protrusion and the extended end thereof is connected to the cover.

(3) The metallic member and the cover respectively have a comb-like connecting part and these comb-like connecting parts are engaged and soldered together.

(4) The housing is equipped with a heat-radiating block on a surface facing to an optical disk, the laser diode is fixed to a support member, the support member is bonded to the housing by adhesive, and the heat-radiating block is thermally connected to the support member.

(5) The cover is equipped with two surfaces respectively facing to two surfaces of the housing excluding the surface equipped with an object lens of the optical system and covers part of the wiring.

(6) The laser diode is composed of a frame type laser diode.

According to the present invention, the optical pickup device enable to assure high reliability and productivity by providing a heat-radiating path from a laser diode to a housing, increase heat releasing ability of the laser diode by providing a heat-radiating path with low thermal conductivity towards other than the housing, and give high heat releasing ability also to a plastic housing.

DETAILED DESCRIPTION OF THE INVENTION

Figure 1:
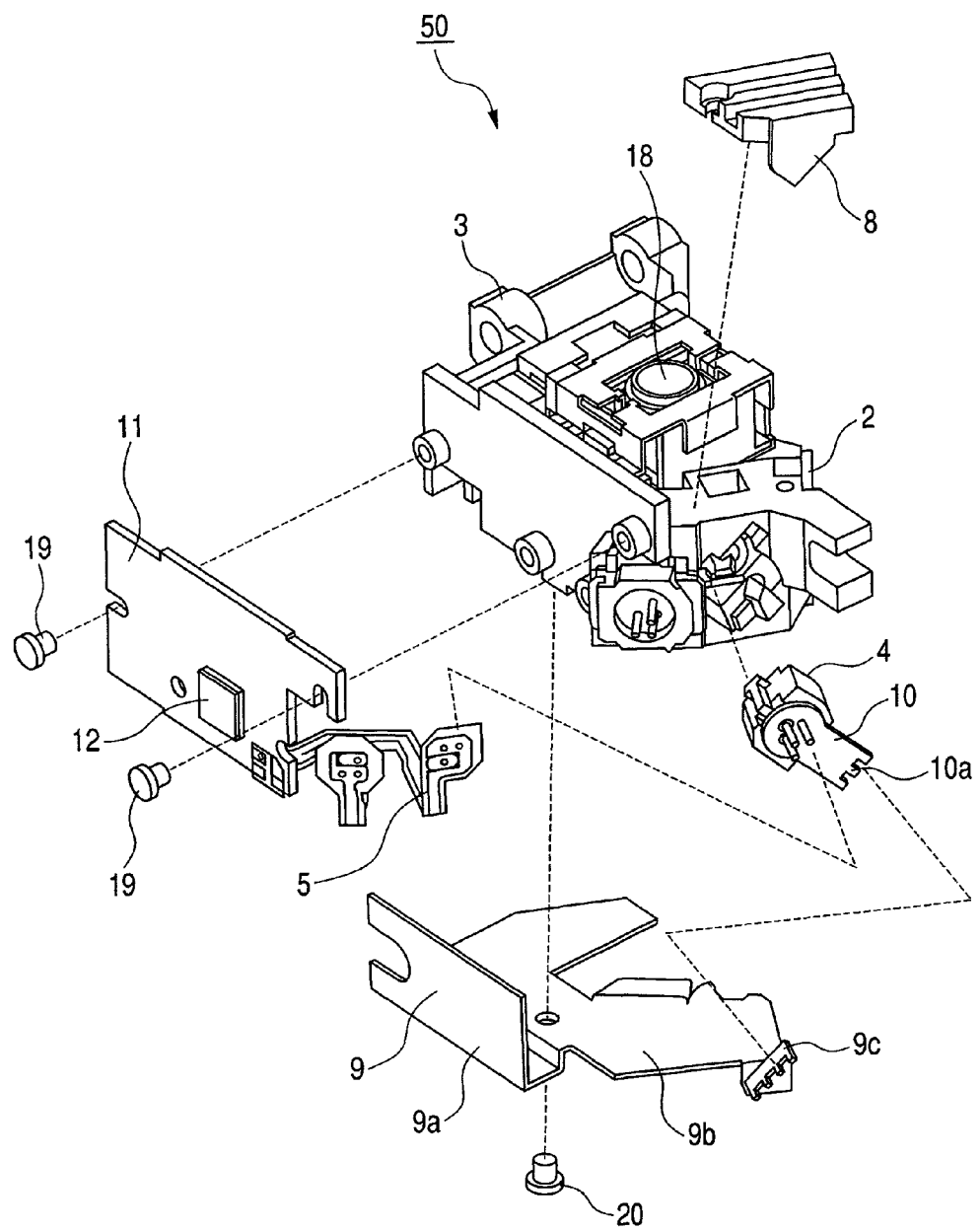
FIG. 1 is an exploded oblique perspective view of an optical pickup device of the first embodiment in the present invention.

A plurality of embodiments of the present invention will be explained below with reference to the accompanying drawings. In the drawings of the embodiments, same number of component means to same component or similar element.

Embodiment 1

An optical pickup device which is the first embodiment of the present invention will be explained below referring to FIG. 1 to FIG. 4.

Figure 2:
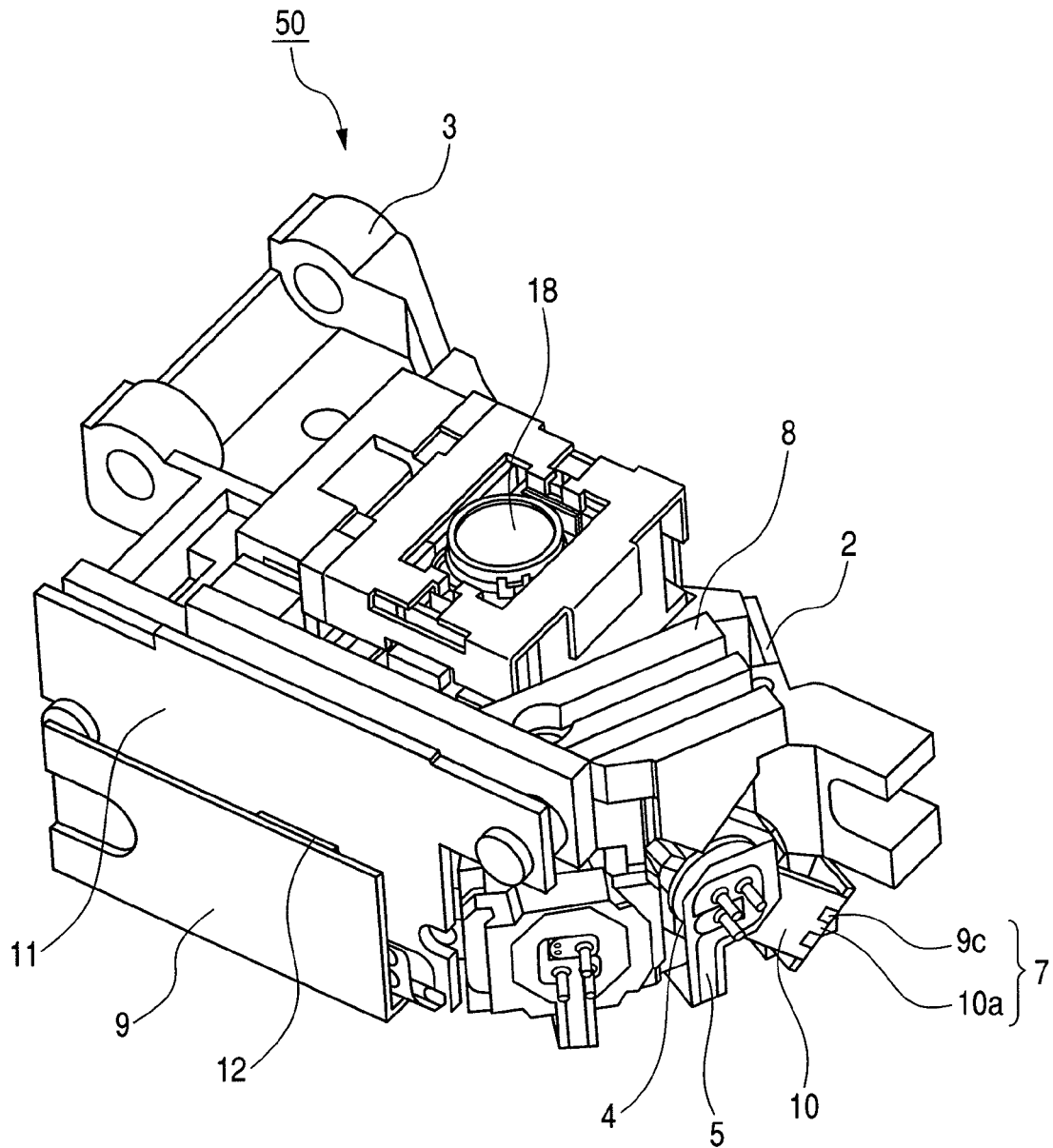
FIG. 2 is an oblique perspective view of the assembled optical pickup device of the first embodiment in the present invention shown in FIG. 1.
Figure 3:
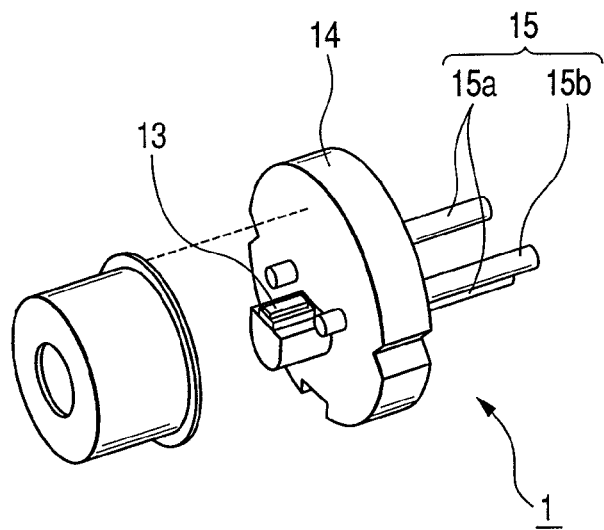
FIG. 3 is an exploded oblique perspective view of a laser diode used in the optical pickup device of the first embodiment in the present invention.
Figure 4:
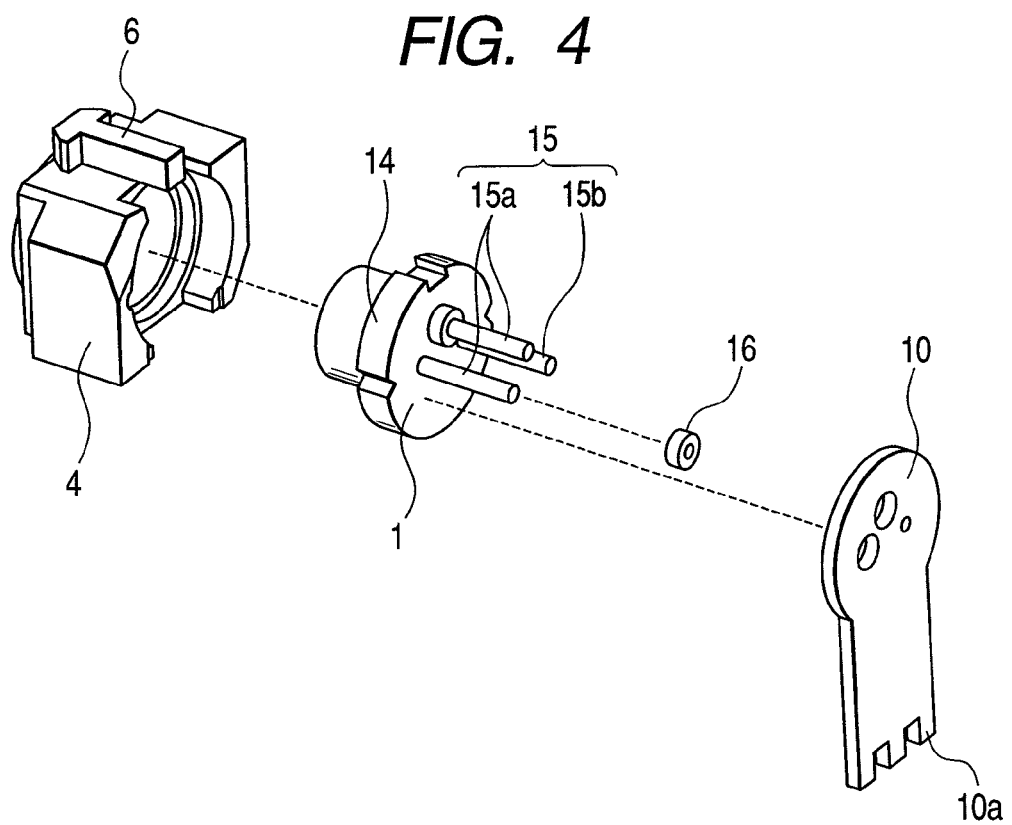
FIG. 4 is an exploded oblique perspective view of the laser diode and its vicinity of the optical pickup device of the first embodiment in the present invention.
Figure 5:
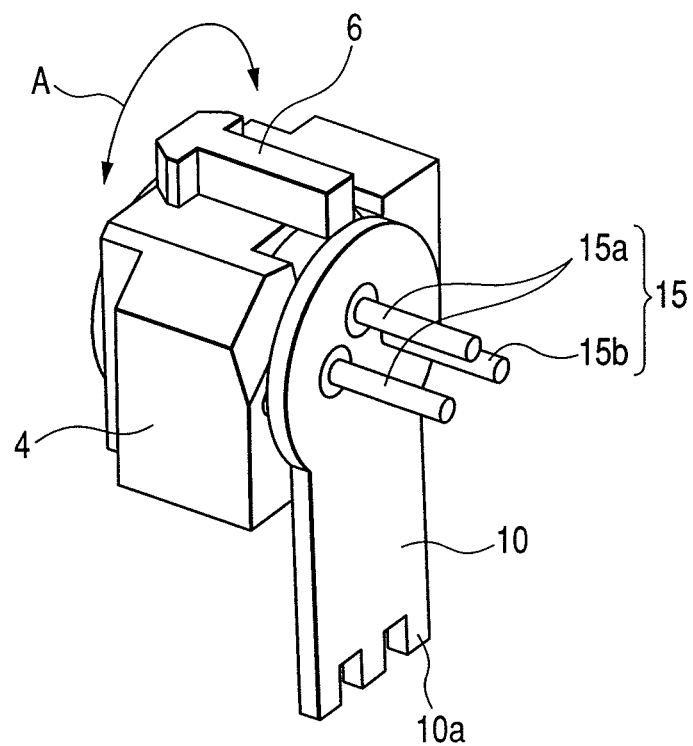
FIG. 5 is an oblique perspective view of the assembled optical pickup device of the first embodiment in the present invention shown in FIG. 4.

First, the whole configuration of optical pickup device 50 of the present embodiment is described with reference to FIG. 1 to FIG. 4. FIG. 1 is an exploded oblique perspective view of an optical pickup device of the present embodiment. FIG. 2 is an oblique perspective view of the assembled optical pickup device of the present embodiment shown in FIG. 1. FIG. 3 is an exploded oblique perspective view of a laser diode used in the present embodiment. FIG. 4 is an exploded oblique perspective view of the laser diode and its vicinity of the optical pickup device of the present embodiment. FIG. 5 is an oblique perspective view of the assembled optical pickup device of the present embodiment shown in FIG. 4.

Referring to FIG. 1 and FIG. 2, optical pickup device 50 is mainly equipped with a laser diode 1 (see FIG. 3), an optical system, a housing 3, a supporting member 4, a wiring 5, a heat radiation block 8, a cover 9, a metallic member 10, and an electronic printed circuit board 11.

The laser diode 1 is supported by the supporting member 4 with most of the laser diode enclosed in the supporting member 4. The supporting member 4 is provided on the side of the housing 3 and bonded thereto by adhesive. The metallic member 10 is thermally connected and fixed to the laser diode 1. The metallic member 10 is made of a flat plate material, extends downward from the laser diode 1, and has a comb-shaped part 10a at the lower end thereof.

The housing 3 has a complicated three-dimensional structure equipped with an optical system having multiple optical parts, which is made of plastic resin. The housing 3 made of plastic resin can make the housing cheaper and less weight as compared with the housing made of metallic material, although it reduces the heat radiation performance.

When receiving the optical axis of laser light from the laser diode 1 in a preset range, the optical system guides laser light towards an optical disk through an object lens 18 and guides laser light reflected on the optical disk into a photo detector 2. Object lens 18 is provided on the top surface of the housing 3 and photo detector 2 is provided on the lateral surface of the supporting member 4.

The electronic printed circuit board 11 is provided on the front surface of the housing 3 and fixed to the housing 3 by a screw 19. The electronic printed circuit board 11 has a laser driver 12 on the circuit board.

The wiring 5 is a flexible printed circuit sheet to connect a wiring of the electronic printed circuit board 11 and a terminal unit 15 of the laser diode 1, and extends from the lateral outer side of the metallic member 10 to the terminal unit 15 through a space under the electronic printed circuit board 11 and the housing 3.

The cover 9 is provided with two surfaces which respectively face to two surfaces (front and bottom surfaces in the drawing) of the housing 3 and fixed to the housing 3 by a screw 20. Therefore, the cover 9 has a very wide area. Substantially, the cover 9 is made of a metal plate which comprises a front part 9a to be placed before the housing 3 and the electronic printed circuit board 11, a bottom part 9b to be placed under the housing 3 and the wiring 5, and a comb-shaped part 9c. The cover 9 is made from a metallic plate by press working. The front part 9a of the cover 9 is thermally connected to the laser driver 12. The bottom part 9b of the cover 9 is provided to cover the wiring 5 which extends downward below the housing 3. The comb-shaped part 9c of the cover 9 is engaged with the comb-shaped part 10a of the metallic member 10 and soldered together.

Referring to FIG. 3 to FIG. 5, the laser diode 1 is made of a stem type laser diode. The laser diode 1 is equipped with a laser diode chip 13 which emits laser, a disk-shaped frame 14 made of conductive metallic material, and a multiple terminals 15. The laser diode chip 13 is provided on one of flat surfaces of the frame 14. The multiple terminals 15 are LD terminals 15a and a common terminal 15b and protruded far from the other flat surface of the frame 14. The LD terminals 15a is mounted on the frame 14 with an insulating material between them and connected to the laser diode chip 13 with fine wires. In most cases, the common terminal 15b is structurally in direct contact with the frame 14 or is approximately at the same electric potential as that of the frame.

The heat generating part of the laser diode 1 is the laser diode chip 13. Almost all heat generated by the laser diode chip 13 is transferred to the frame 14. Since a wall is required by the support member 4 which is bonded to the housing 3 and the wiring 5 must be connected to the surface of the frame 14 from which the terminals 15 are protruded, the laser diode 1 is mounted on the support member 4 with the terminal surface faced outward and the outer periphery of the frame 14 is in contact with the support member 4. Therefore, heat is transferred from the laser diode chip 13 to the frame 14 and from the outer periphery of the frame 14 to the support member 4. However, since the laser diode chip 13 is provided in the center of the frame 14, the terminal surface of the frame 14 is closer to the heat generating part than the outer periphery of the frame 14 and can radiate heat easily.

Consequently, present embodiment provides metallic member 10 on the terminal surface of the frame 14 of the laser diode 1 to radiate heat efficiently as shown in FIG. 4. In this structure, the frame 14 and the common terminal 15b can electrically touch the metallic member 10 but cannot touch the LD terminal 15a directly. To prevent the LD terminal 15a from electrically touching the metallic member 10, terminal holes bigger than the terminals should be provided on the metallic member 10 or spacers 16 should be applied to the LD terminals 15a in advance, so that short between the LD terminals 15a and the metallic member 10 is avoided.

By using the common terminal 15b or the LD terminals 15a with the spacers 16 to position the metallic member, the error of mounting the metallic member 10 on the laser diode 1 can be suppressed to some extent. Further, an approximate displacement of the laser diode 1 when the laser diode 1 is mounted and adjusted on the housing 3, can be assumed. This can be helpful in designing the tolerance in clearance of engagement of the comb-shaped parts 10a and 9c.

When metal which can be soldered is selected for the metallic member 10, the metallic member 10 can be soldered to the terminal surface of the laser diode 1 and the optical pickup device can obtain high heat radiation performance. Further, also when metallic member 10 is bonded to the terminal surface of the laser diode 1 by adhesive, the adhesive layer can be as thin as possible since the flat surface of the metallic member 10 is bonded to the flat surface of the laser diode 1, so that heat resistance can be reduced.

A protrusion 6 is provided on the support member 4 so that the support member 4 may rotate in the direction A as shown in FIG. 5. This can reduce the displacement of the support member 4 due to adjustment. Further, when the metallic member 10 is extended in the direction of projection of the protrusion 6, that is, in the direction of the rotary axis of adjustment and the furthermost end of the metallic member 10 is connected to the cover 9, a load due to deformation of the cover 9 onto the laser diode 1 will be suppressed (except for a rotational component of adjustment). This can also suppress the positional displacement of the laser diode 1 due to deformation of the cover 9. The deformation of the cover 9 is a deformation caused by a difference between expansion coefficients of the part at high and low temperatures. Further, the cover 9 as shown in FIG. 1 has a bent part before the comb-shaped structure 9c of the cover 9 to increase the surface area of the cover 9. This prevents stresses due to the deformation of the cover 9 from transferring to the laser diode 1.

Referring to FIG. 5, the metallic member 10 is soldered to the laser diode 1 and the resulting the laser diode 1 assembly is mounted on the support member 4. The assembled unit as shown in FIG. 5 is bonded to the housing 3 while being adjusted. In this case, an adhesive that will be hardened by UV rays is used. This adhesive can bond the assembled unit to the housing quickly by applying UV light to the assembly just after the laser diode is positioned correctly. This can reduce the production time and increase the productivity.

To increase the performance to radiate heat from the laser diode 1 to the housing 3, the clearances between the housing 3 and the support member 4 or the laser diode 1 should be filled with fluid of high thermal conductivity such as a thermal conductive silicone after bonding. This can increase the heat radiation performance without shifting of the position of the fixed laser diode 1. In this case, it is important that the clearances between the laser diode 1 and the housing 3 should be filled with a non-air substance which does not give any excessive load to the fixed laser diode 1. The fluid of high heat radiation performance can contain not only a mixture of silicone and thermal conductive filler but also adhesives to be hardened later.

After the laser diode 1 is mounted on the housing 3, the electronic printed circuit board 11 is mounted on the housing 3 and the wiring 5 is connected to the laser diode 1. The electronic printed circuit board 11 is equipped with the laser driver 12 which is an integrated circuit to drive the laser diode 1. The wiring 5 is connected to the electronic printed circuit board 11, too.

After the electronic printed circuit board 11 and the wiring 5 are mounted on the housing 3, the cover 9 is mounted on the housing 3. Mounting the cover 9 on the housing 3 after connecting the wiring 3 has an effect of causing the cover 9 to prevent the wiring 5 from sagging. One of objects of the cover 9 is to have a production information label on it. Therefore, the cover 9 requires an area wide enough for it. So the cover 9 is provided opposite to the disk-facing side of the optical pickup device 50.

Here, the disk-facing side of the optical pickup device 50 is the surface (top surface in the drawing) of the optical pickup device 50 from which laser light is emitted to an optical disk. This surface contains the object lens 18. For an optical pickup device whose downsizing is always demanded, it is impossible to provide a cover which has a flat surface wide enough to attach the product information label.

The present embodiment provides the cover 9 opposite to the disk-facing surface of the optical pickup device to make the optical pickup device 50 more compact. Further, the present embodiment places the cover 9 in front of the optical pickup device 50 to cool the laser driver 12 which is provided on the front side. The cover 9 having a great surface area is very effective as a heat radiation part and also available to release heat of the laser driver 12.

Particularly to increase the heat radiation effect of the metallic member 10 in the present embodiment, it is effective to increase the heat radiation performance of the cover 9. The bent (pleated) structure of the cover 9 is helpful to increase the surface area and consequently increase the heat radiation performance of the surface. By the way, in most cases, the product information label has a greater heat radiation performance than a metallic surface and is useful to improve the heat radiation performance of the cover.

The present embodiment provides the comb-shaped structure 7 which is made up of the comb-shaped part 9c of the cover 9 and the comb-shaped part 10a of the metallic member 10. These comb-shaped parts 9c and 10a are designed to be engaged when the cover 9 is mounted on the housing 3. The clearance between the comb-shaped part 10a of the metallic member 10 and the comb-shaped part 9c of the cover 9 is designed to absorb the displacement of the metallic member 10 due to adjustment of the laser diode 1. When the parts are assembled, the metallic member 10 is not in contact with the cover 9.

By soldering the engaged part of the comb-shaped parts 9c and 10a, heat can be transferred from the laser diode 1 to the cover 9 with a low heat resistance. The comb-shaped structure 7 can be soldered steadily and easily since its surface area is wide. The comb-shaped structure 7 enables adjustment of the laser diode 1 and simultaneously establishes a path to release heat to the cover 9. Particularly, the electrical connection of the cover 9 and the laser diode 1 by soldering can give an effect similar to that the common terminal 15b and the cover 9 are at an identical electric potential. This can improve the electric characteristics of the laser diode 1.

It is also possible to absorb the displacement due to adjustment of the laser diode 1 and assure heat radiation performance by filling clearances between the metallic member 10 and the cover 9 with fluid material of high thermal conductivity such as the thermal conductive silicone. In this case, a clearance of a certain width must be provided between the metallic member 10 and the cover 9 to absorb the displacement due to adjustment of the laser diode 1. However, when this clearance becomes wider, the heat resistance becomes greater. This problem can be dissolved by increasing the area for thermal conductivity. The heat radiation performance can be assured by providing a wide surface on the metallic member 10 which faces to the cover 9 and filling the space between these surfaces with the thermal conductive silicone.

Further, to increase the heat radiation performance of the laser diode 1, the heat radiation block 8 is provided on the surface which faces to the disk. The end surface of the heat radiation block 8 is in direct contact with the support member 4 or the clearance between the end surface of the heat radiation block 8 and the support member 4 is filled with fluid of high thermal conductivity such as the thermal conductive silicone so that heat of the laser diode 1 may be released from the disk-facing surface. Particularly, when the housing 3 is made of plastic resin, the heat radiation performance of the housing 3 is less effective. It is very important to provide a heat radiation surface other than the housing 3 and suppress increase of temperature of the laser diode 1. Fin-shaped heat radiation block 8 will be effective when placed on the disk-facing surface. Particularly in the vicinity of the optical disk, the wind caused by the rotation of the optical disk increases the heat radiation performance. The high heat radiation performance can be obtained by placing heat radiation block 8 as high as the object lens 18 if possible.

The present embodiment provides three heat radiation paths from the laser diode 1: path to release heat to the housing 3 by means of conventional adhesive or heat-radiating fluid material, path provided on the disk-facing surface to release heat to the heat radiation block 8, and path to release heat to the cover 9 by means of the metallic member 10. With these paths, the present embodiment can suppress temperature-rise of the laser diode 1.

As described above, by providing the metallic member 10 on a place which is most effective in heat radiation of the laser diode 1 so that the metallic member 10 and the cover 9 may absorb the displacement of the laser diode 1 due to adjustment, the heat radiation performance of the laser diode 1 can be increased while the reliability and productivity of the conventional structure of the laser diode 1 and the housing 3 remain high. Further, this structure can release heat from the laser diode 1 effectively through the cover 9. Therefore, even when the housing 3 is made of plastic resin whose heat radiation performance is less effective, the heat radiation performance of the laser diode 1 can be assured. Further, by providing the heat radiation block 8 on the disk facing surface of the optical pickup device 50 and connecting the laser diode 1 to the support member 4 directly or with a thermal conductive material between them, the heat radiation performance of the laser diode 1 can be assured independently of materials of the housing 3.

Embodiment 2

Figure 6:
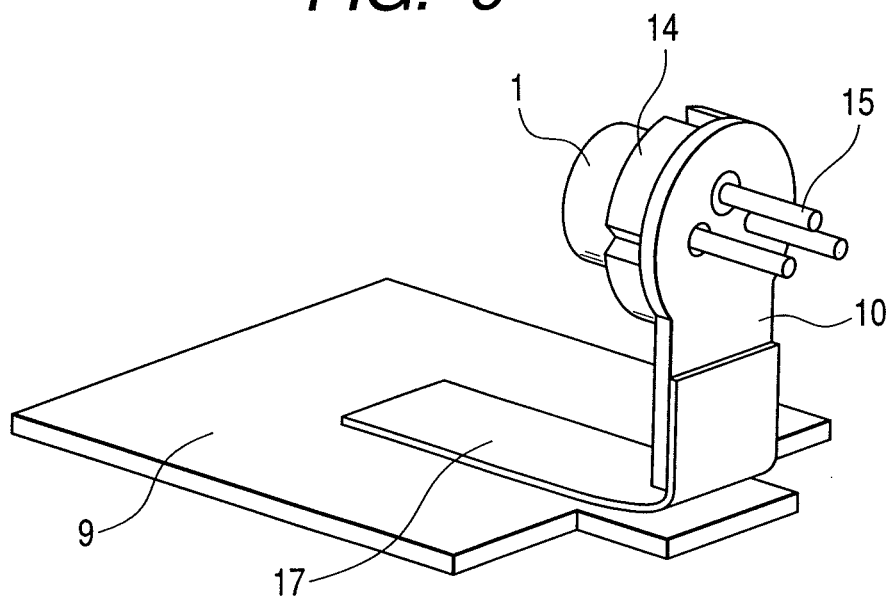
FIG. 6 is a drawing of structure connecting a metallic member and a cover of an optical pickup device of the second embodiment in the present invention.

An optical pickup device which is the second embodiment of the present invention will be explained below referring to FIG. 6. FIG. 6 is an explanatory drawing of a structure which connects a metallic member and a cover of an optical pickup device which is the second embodiment of the present invention. The second embodiment is basically the same as the first embodiment except for the following:

The structure of the present embodiment which connects the metallic member 10 and the cover 9 is designed to absorb the displacement due to adjustment and reduce the heat resistance. Substantially, the structure connects the metallic member 10 and the cover 9 with a graphite sheet 17. The graphite sheet 17 is flexible and high thermal-conductive and excellent as a material, which can transfer heat while absorbing the displacement of the laser diode 1 due to adjustment. A strand of fine copper wires can substitute for the graphite sheet 17. The graphite sheet 17 is fixed to the metallic member 10 and the cover 9 with double-stick tape or adhesive. When a strand of fine copper wires is used, it can be soldered for connection.

Embodiment 3

Figure 7:
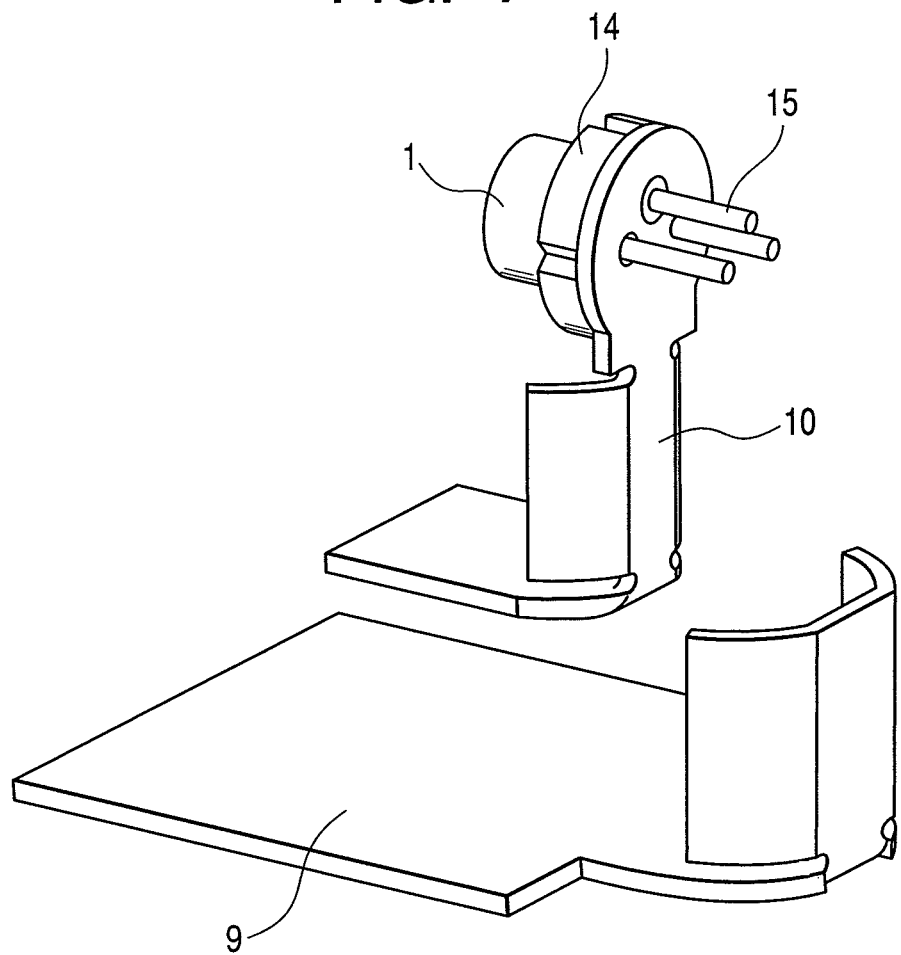
FIG. 7 is a drawing of structure connecting a metallic member and a cover of an optical pickup of the third embodiment in the present invention.

An optical pickup device which is the third embodiment of the present invention will be explained below referring to FIG. 7. FIG. 7 is an explanatory drawing of a structure which connects a metallic member and a cover of an optical pickup device which is the third embodiment of the present invention. The third embodiment is basically the same as the first embodiment except for the following:

The third embodiment provides a curved surface whose center is aligned to the center of rotational adjustment between the metallic member 10 and the cover 9. This structure does not require a space to absorb the displacement of the laser diode 1 due to adjustment when the rotational adjustment of one axis of the laser diode 1 is done using the support member 4 which has the protrusion 6. However, also in this case, it is impossible to make the surface of the metallic member 10 and the surface of the cover 9 in contact with each other completely. So it is recommended to fill the space between the metallic member 10 and the cover 9 with the heat-radiation fluid such as the thermal conductive silicone.

Embodiment 4

Figure 8:
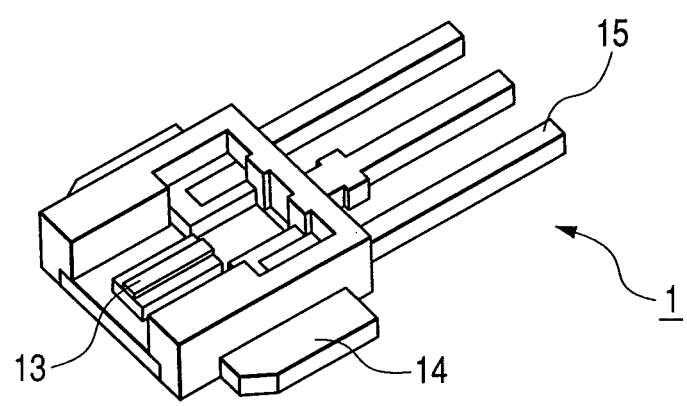
FIG. 8 is an oblique perspective view of a laser diode used in an optical pickup device of the fourth embodiment in the present invention.
Figure 9:
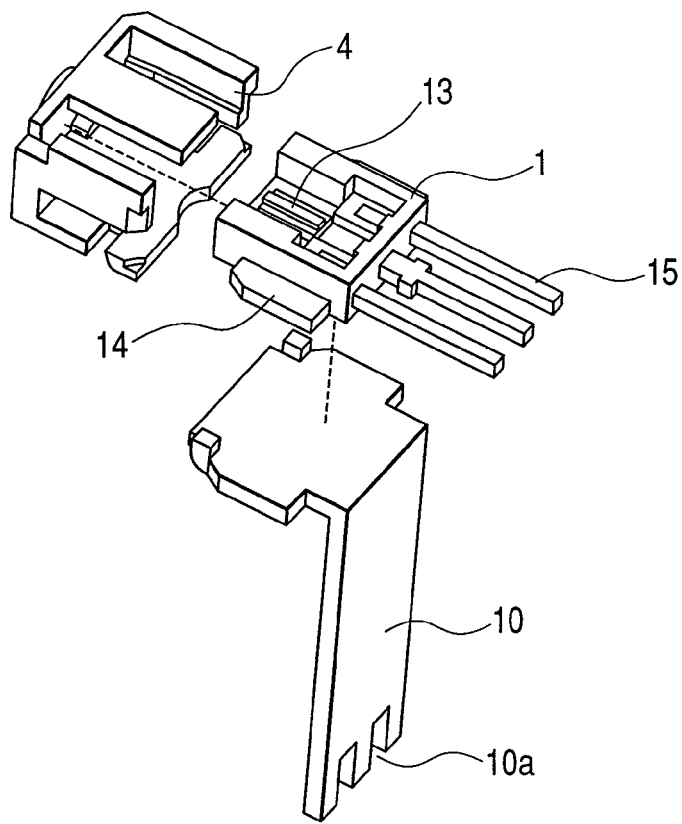
FIG. 9 is an exploded oblique perspective view of a laser diode in the optical pickup and its vicinity in the fourth embodiment of the present invention.
Figure 10:
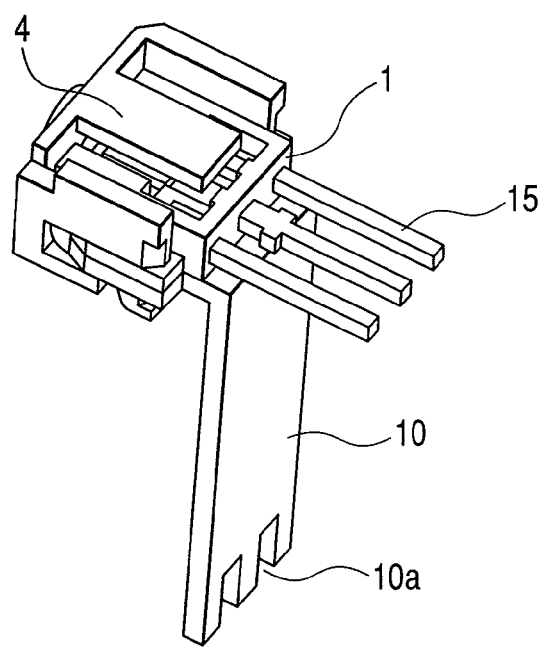
FIG. 10 is an oblique perspective view of the assembled optical pickup device of the fourth embodiment in the present invention shown in FIG. 9.

An optical pickup device which is the fourth embodiment of the present invention will be explained below referring to FIG. 8 to FIG. 10. FIG. 8 is an exploded oblique perspective view of a laser diode used in an optical pickup device of the present embodiment. FIG. 9 is an exploded oblique perspective view of a laser diode in the optical pickup in the fourth embodiment and its vicinity. FIG. 10 is an oblique perspective view of the assembled optical pickup device as shown in FIG. 9. The fourth embodiment is basically the same as the first embodiment except for the following:

The fourth embodiment uses a frame type laser diode 1 as a semiconductor laser unit. Plate-shaped frame 14 of the laser diode 1 is provided just under the laser diode 1 so that the frame 14 may easily release heat from the laser diode 1. Different from the stem-type laser diode, the terminal surface of the frame type laser diode 1 is a little away from the heat source. Further, the surface area of the frame type laser diode 1 is narrow since the laser diode 1 is very thin.

Accordingly, the fourth embodiment provides metallic member 10 on the frame 14 which is under the laser diode 1 and mounts the metallic member 10 and the laser diode 1 on the support member 4 as shown in FIG. 9 and FIG. 10. In most cases, the support member 4 is made by die-casting and cannot be soldered to the frame 14. However, since the metallic member 10 can be soldered to the frame 14 under the laser diode chip 13, the connection can have a high heat radiation performance. Further, heat transfer to the housing 3 can also be assured since the metallic member 10 can transfer heat to the support member 4. Furthermore, stem type laser diode 1 can use terminals for positioning, but the stem type laser diode 1 does not use the terminal surface. To enable positioning, it is necessary to provide a bent part or a protrusion on the metallic member 10 so that positioning may be enabled by the external shape of the laser diode 1.

What is claimed is:

1. An optical pickup device comprising a laser diode, a photo detector, a housing having an optical system for guiding light from the laser diode to an optical disk and guiding light reflected on the optical disk to the photo detector, a wiring to supply current to the laser diode, and a metallic cover provided outside of the housing, wherein the laser diode is bonded to the housing by adhesive, a metallic member is mounted on the surface of the laser diode by connecting thermally, and the metallic member is thermally connected to the cover by solder, wherein the laser diode comprises a frame made of conductive metal, a laser diode chip provided on one of flat surfaces of the frame, and multiple terminals protruded from the other flat surface of the frame, and the metallic member is thermally connected to the other flat surface of the frame, and wherein the laser diode is fixed to a support member equipped with a protrusion for working as a rotary shaft, the support member is bonded to the housing by the adhesive so that the support member can rotate with the protrusion as a rotating axis, the metallic member is extended along the rotary shaft of the protrusion and the extended end thereof is connected to the cover.

2. An optical pickup device according to claim 1, wherein the metallic member and the cover respectively have a comb-like connecting part and these comb-like connecting parts are engaged and soldered together.

3. An optical pickup device according to claim 1, wherein the housing is equipped with a heat-radiating block on a surface facing to an optical disk, the laser diode is fixed to a support member, the support member is bonded to the housing by adhesive, and the heat-radiating block is thermally connected to the support member.

4. An optical pickup device according to claim 1, wherein the cover is equipped with two surfaces respectively facing to two surfaces of the housing excluding the surface equipped with an object lens of the optical system and covers part of the wiring.

* * * * *